United States Patent [19]
Gojo

[11] Patent Number: 4,555,191
[45] Date of Patent: Nov. 26, 1985

[54] METHOD OF REDUCING CHARACTER FONT

[75] Inventor: Tomomi Gojo, Zama, Japan

[73] Assignee: Ricoh Company, Ltd., Tokyo, Japan

[21] Appl. No.: 668,319

[22] Filed: Nov. 5, 1984

[30] Foreign Application Priority Data

Nov. 5, 1983 [JP] Japan .................... 58-206914

[51] Int. Cl.⁴ ............ B41J 3/02; H04N 1/00
[52] U.S. Cl. ................. 400/121; 340/728; 340/731; 340/735; 340/745; 382/56; 400/110
[58] Field of Search ........... 400/121, 110, 62, 124; 340/728, 731, 735, 745; 358/263; 382/56

[56] References Cited

U.S. PATENT DOCUMENTS

| | | | |
|---|---|---|---|
| 3,604,846 | 9/1971 | Behane | 358/263 |
| 4,090,188 | 5/1978 | Suga | 340/731 |
| 4,129,860 | 12/1978 | Yonezawa | 340/728 |
| 4,216,480 | 8/1980 | Buehner | 400/126 X |
| 4,242,678 | 12/1980 | Somerville | 340/728 |
| 4,288,816 | 9/1981 | Kashioka et al. | 382/56 |
| 4,476,464 | 10/1984 | Hobbs | 340/731 |

FOREIGN PATENT DOCUMENTS

| | | | |
|---|---|---|---|
| 8024 | 1/1978 | Japan | 340/731 |
| 14674 | 1/1983 | Japan | 358/263 |

*Primary Examiner*—Paul T. Sewell
*Attorney, Agent, or Firm*—Oblon, Fisher, Spivak, McClelland & Maier

[57] ABSTRACT

A method of reducing the size of a character font in a word processor or an office computer. Digitized font data representative of a character font is constructed in a dot matrix consisting of a plurality of rows in an X direction and a plurality of columns in a Y direction perpendicular to the X direction. The first row of dots in the X direction is divided into a plurality of blocks and each block is provided with a ONE or a ZERO depending upon the number of dots included therein. The first row is shifted one dot to the left in the X direction to form a shifted row. The shifted row is divided into a plurality of blocks and each of these blocks is provided with a ONE or a ZERO depending upon the number of dots included therein. ANDs of the respective logical values of the shifted and non-shifted rows in the Y direction are computed to obtain a ONE or ZERO block by block. These consecutive steps are repeated on all the rows in the X direction to thereby provide a ONE or a ZERO for each of the blocks in all the rows. Each of the columns in the Y direction represented by ONEs and ZEROs of the blocks in the X direction is divided into a plurality of blocks. ANDs in the Y direction are computed block by block to decide the blocks whose ANDs are ONEs to be black dots.

5 Claims, 17 Drawing Figures

METHOD OF REDUCING CHARACTER FONT

BACKGROUND OF THE INVENTION

The present invention relates to a method of varying the font size of characters, numerals, marks, symbols and the like (hereinafter generally referred to as "characters" for convenience) and, more particularly, to a method of reducing a character font size.

Word processors, office computers and the like are modern implementations extensively used for documents processing. In such implementations, besides ordinary characters consisting of a 24 by 25 dot matrix, characters in a smaller size or a larger size are often required. Especially, in Japanese, the demand for reduction of the character size is keen due to double constants and contracted sound involved therein. Concerning Japense, even a word processor or the like has come to be required to prepare a harmonious and orderly document as experienced in showing the reading of addresses and names by printing kana at their sides and such has been reflected by an increasing demand for reduced character fonts.

One approach to realize document processing with a reduced character size is storing the fonts of reduced characters in advance in a font memory. This, however, would require a font memory having an increased capacity. Another approach is generating reduced fonts by means of a word processor or like apparatus. For example, in a layout mode of a word processor designed for Japanese, exclusive patterns for discriminating kanji (Chinese characters) and the other characters is available for selecting a layout in a document page. The problem with the predetermined pattern scheme is that although one may readily grasp the layout in one document page, he or she experiences difficulty in recognizing a positional relationship between sentences and graphs. While such problems may be settled if the operator himself prepares reduced documents, the operation would consume disproportionate time and labor.

SUMMARY OF THE INVENTION

It is therefore an object of the present invention to provide a method which readily achieves a reduced character font without inviting any increase in the required capacity of a font memory.

It is another object of the present invention to provide a generally improved method of reducing a character font.

A method of reducing a character font in which font data representative of the character font consists of a dot matrix having a plurality of rows of arranged in a first direction and a plurality of columns of arranged in a second direction perpendicular to the first direction of the present invention comprises the steps of (a) producing first data by dividing one of the rows in the first direction into a plurality of blocks such that each of the blocks includes a predetermined number of dots and, then, converting the one row to unit dots associated with the respective blocks, (b) producing second data by shifting the row in the step (a) in the first direction to constitute a shifted row, then dividing the shifted row into a plurality of blocks, and then converting the shifted row to unit dots associated with the respective blocks, (c) computing third data by associating the first and second data with each other in the second direction, (d) computing third, row-by-row data by sequentially performing the steps (a), (b) and (c) in the second direction on the rows of a number which corresponds to the predetermined number, (e) computing fourth data by associating in the second direction the third, row-by-row data computed by the step (d), (f) computing the fourth data associated with the whole character font by repeating the consecutive steps (a) through (e), and (g) converting the respective blocks consisting of dots associated with the plurality of fourth data computed by the step (f) to unit dots associated with the respective blocks.

In accordance with the present invention, a method of reducing the size of a character font in a word processor or an office computer is provided. Digitized font data representative of a character font is constructed in a dot matrix consisting of a plurality of rows in an X direction and a plurality of columns in a Y direction perpendicular to the X direction. The first row of dots in the X direction is divided into a plurality of blocks and each block is provided with a ONE or a ZERO depending upon the number of dots included therein. The first row is shifted one dot to the left in the X direction to form a shifted row. The shifted row is divided into a plurality of blocks and each of these blocks is provided with a ONE or a ZERO depending upon the number of dots included therein. ANDs of the respective logical values of the shifted and non-shifted rows in the Y direction are computed to obtain a ONE or ZERO block by block. These consecutive steps are repeated on all the rows in the X direction to thereby provide a ONE or a ZERO for each of the blocks in all the rows. Each of the columns in the Y direction represented by ONEs and ZEROs of the blocks in the X direction is divided into a plurality of blocks. ANDs in the Y direction are computed block by block to decide the blocks whose ANDs are ONEs to be black dots.

The above and other objects, features and advantages of the present invention will become more apparent from the following detailed description taken with the accompanying drawings.

DESCRIPTION OF THE PREFERRED EMBODIMENT

While the method of reducing character font of the present invention is susceptible of numerous physical embodiments, depending upon the environment and requirements of use, a substantial number of the herein shown and described embodiments have been made, tested and used, and all have performed in an eminently satisfactory manner.

The construction in accordance with the present invention will be described in conjunction with one embodment thereof. In this particular embodiment, reduction of a 24 by 24 dot matrix to an 8 by 8 dot matrix is assumed by way of example.

Figure 1:
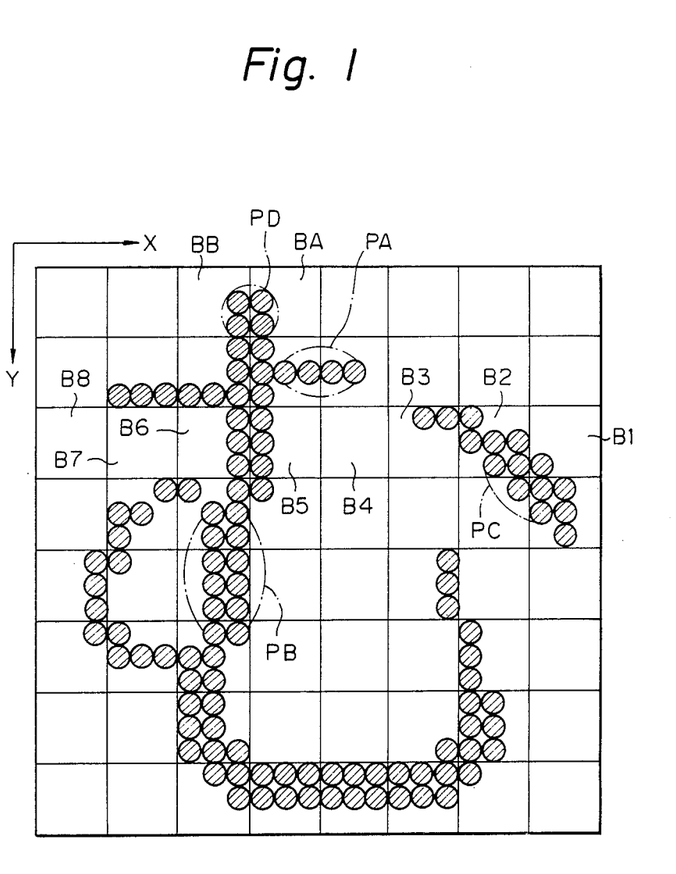
FIG. 1 shows an example of a character font which is represented by a 24 by 24 dot matrix.
Figure 2:
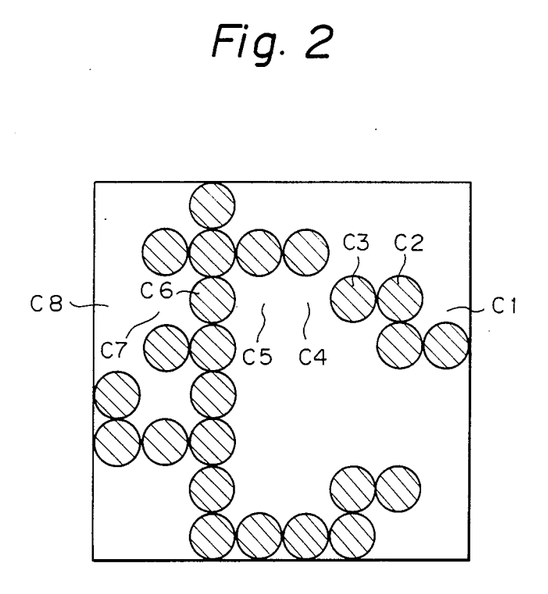
FIG. 2 shows an example of a font which is reduced in accordance with the present invention.

First, the principles of font reduction in accordance with the present invention will be described. In FIG. 1, hiragana (cursive kana character) "  " is shown as an example of 24 by 24 dot characters. When this front is reduced to an 8 by 8 dot font, it appears as shown in FIG. 2. The font shown in FIG. 1 is reduced on the basis of a unit block which consists of a 3 by 3 dot submatrix.

Figure 3A:
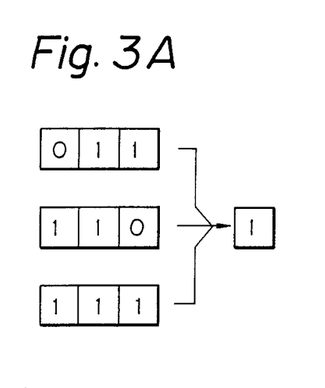
FIGS. 3A and 3B show the principle of reduction in an X direction in accordance with the present invention.
Figure 3B:
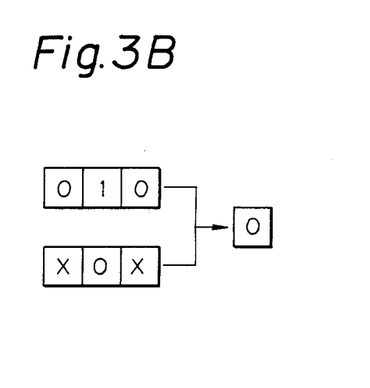
Figure 4A:
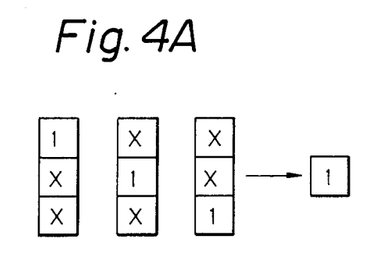
FIGS. 4A and 4B show the principle of reduction in a Y direction in accordance with the present invention.
Figure 4B:
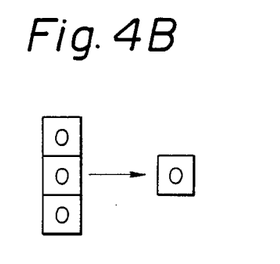
Figure 5A:
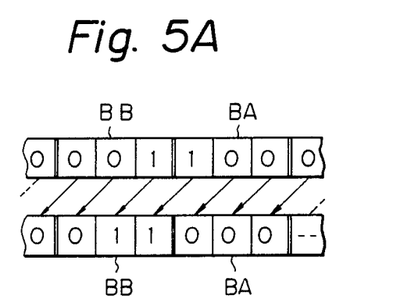
FIGS. 5A and 5B show the principle of the X direction reduction which involves shifting of data.
Figure 5B:
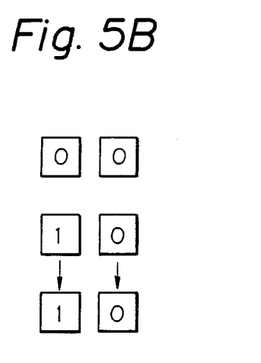

Referring to FIGS. 3–5, a specific conversion method for font reduction is shown. The conversion is attained paying attention to characteristics particular to a font which will be described. Regarding the font shown in FIG. 1, the dot density is higher in the Y or vertical direction than in the X or horizontal direction. That is, while a single dot-string arranement is predominant in the X direction strokes (see PA in FIG. 1), a two dot-strings arrangement is predominant in the Y direction strokes (see PB and PC in FIG. 1). Imaging other kinds of characters will make such tendency more clear. Stated another way, the tendency described above is generally observed in kana, kanji and like characters.

In light of the above characteristics, the reduction in the X direction, or simply X reduction as will be referred to, is performed such that when nearby two bits out of the three bits in each unit block are (binary) "1", meaning that the nearly two dots should be printed out as black dots, the entire block is reduced as "1" (see FIG. 3A). When otherwise, the block is reduced as "0", meaning that it will not be printed out as a dot (see FIG, 3B). In the drawings, the mark "x" shows that bits so marked are either "1" or "0" (DONT'T CARE).

Concerning the reduction in the Y direction, or Y reduction, if at least one bit in the three-bit unit block is "1", the whole block is decided to be "1" and, if otherwise, "0" (see FIGS. 4A and 4B). That is, the reduction effected by performing an AND operation. By the above procedure, the font represented by the 3 by 3 bit block is first reduced by the X reduction to a 3 by 1 bit block and, then, to a 1 by 1 bit font by the Y direction. The sequence of the X reduction and the Y reduction described is not limitative and may be inverted.

The font reduction relying only on the procedure described above entails the following inconvenience. When the X reduction is performed by the above procedure on such a portion as PD shown in FIG. 1 where the Y direction stroke extends over two nearby blocks, both the nearby blocks will be undesirably converted to "0".

The present invention overcomes such inconvenience by employing the following extra operation together with the X reduction shown in FIGS. 3A and 3B. Specifically, the principles of reduction shown in FIGS. 3A and 3B are applied to the stream of bits which are shifted one bit to the left as shown in FIG. 5A and, then, there is provided ANDs of the result of such reduction and the result of reduction shown in FIGS. 3A and 3B which is applied to a state before the shift (see FIG. 5B). It will be noted that the leftward shift, not the rightward, is employed in view of the fact that a 24 by 24 bit font generally carries a far smaller amount of information in the leftmost column than in the rightmost column.

Spcifically, in FIG. 1, observing the second row in nearby blocks BA and BB which include the portion PD, the block BA before the shift is "100" and the block BB "001" and, hence, both of them become "0" after the reduction shown in FIG. 3B (see the top of FIG. 5B). After the shift, the block BA turns to "000" and the block BB to "011" as shown in FIG. 5A. Applying reduction to such bits of the blocks BA and BB makes the block BA "0" as shown in FIG. 3B and the block BB "1" as shown in FIG. 3A (see the middle of FIG. 5B). After the AND operation, the block BA becomes "0" and the block BB "1" and this is the result of the X reduction (see the bottom of FIG. 5B).

Figure 6:
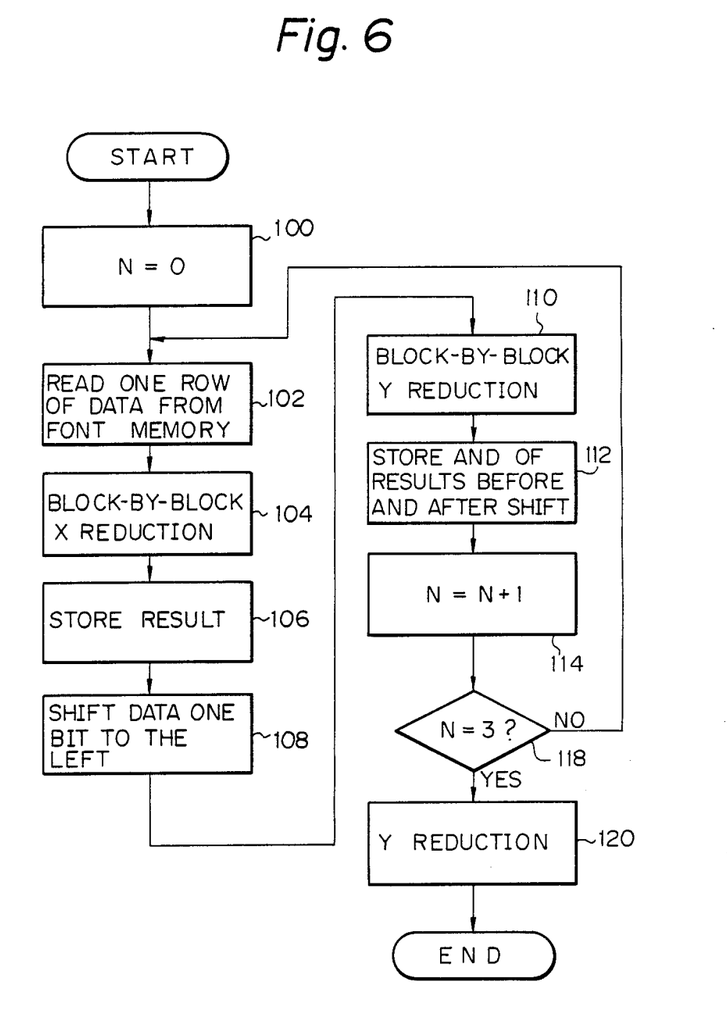
FIG. 6 is a flowchart demonstrating an example of the whole procedure for attaining a reduced font in accordance with the present invention.

Referring to FIG, 6, an exemplary procedure is shown which may be utilized with a computer or the like for the above-described font reduction. The flowchart shown in FIG. 6 represents a procedure associated with one row of blocks extending in the X direction. In the case where the 24 by 24 bit font shown in FIG. 1 is to be reduced to the 8 by 8 bit font, the flow shown in FIG. 6 is repeated eight consecutive times. The reduction procedure will be discussed taking blocks B1 to B8 of FIG. 1 for example.

The procedure starts with setting up a condition "N=0" (100). Here, "N" represents a counter responsive to the number of times of reduction occurring in the X direction and is necessary for the X reduction to be performed on three lines, the counter being initially set to "0".

Figure 7:
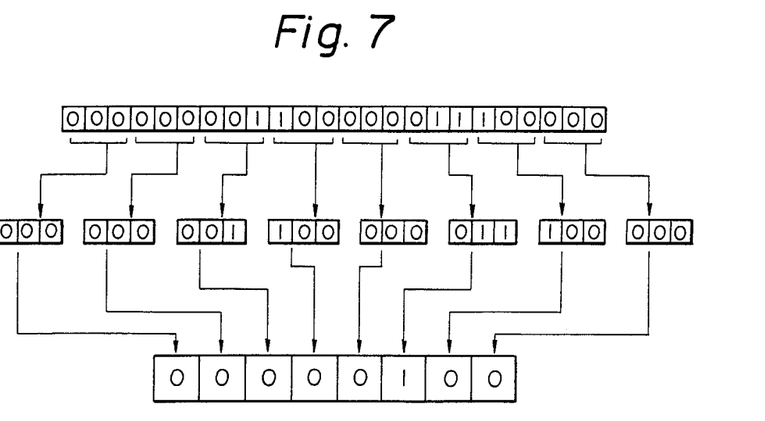
FIG. 7 shows an exemplary operation for reduction in the X direction.

Next, one row of font data are read out of a font memory as shown in the top of FIG. 7 (102). The font data are divided into each three bits (see the middle of FIG. 7) and, then, the X reduction is performed as described in conjunction with FIGS. 3A and 3B (104) (see the middle of FIG. 7). The result is stored in a suitable storage (106) (see the bottom of FIG. 7).

Figure 8A:
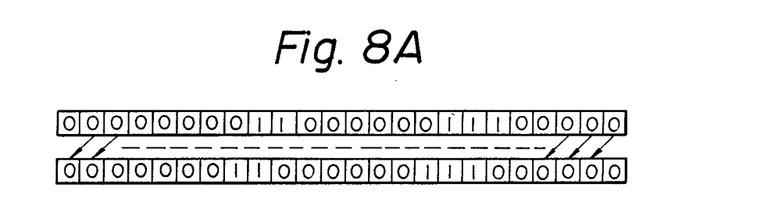
FIGS. 8A and 8B show an exemplary operation for reduction in the X direction with shifting involved.
Figure 8B:
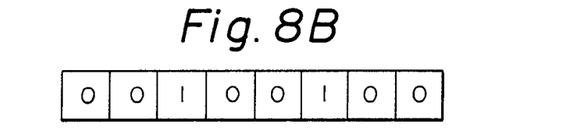
Figure 9:
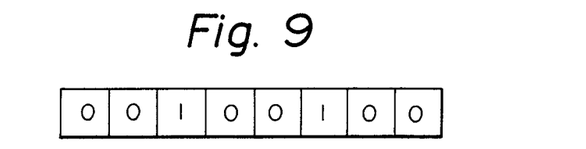
FIG. 9 shows an example of the result of reduction in the X direction.

Then, the font data are bodily shifted one bit to the left as shown in FIG. 8A (108) whereafter the X reduction occurs block by block (110) (see FIG. 7). The result is shown in FIG. 8B. This result and the result of reduction before the shift shown in FIG. 7 are processed to provide their AND which is then stored in a storage (112). The resulting row of eight bits is shown in FIG. 9.

By the operation described so far, the X reduction on the first row of data in the blocks B1 to B8 is completed. Then, the counter is incremented to N=N+1 (114).

Figure 10:
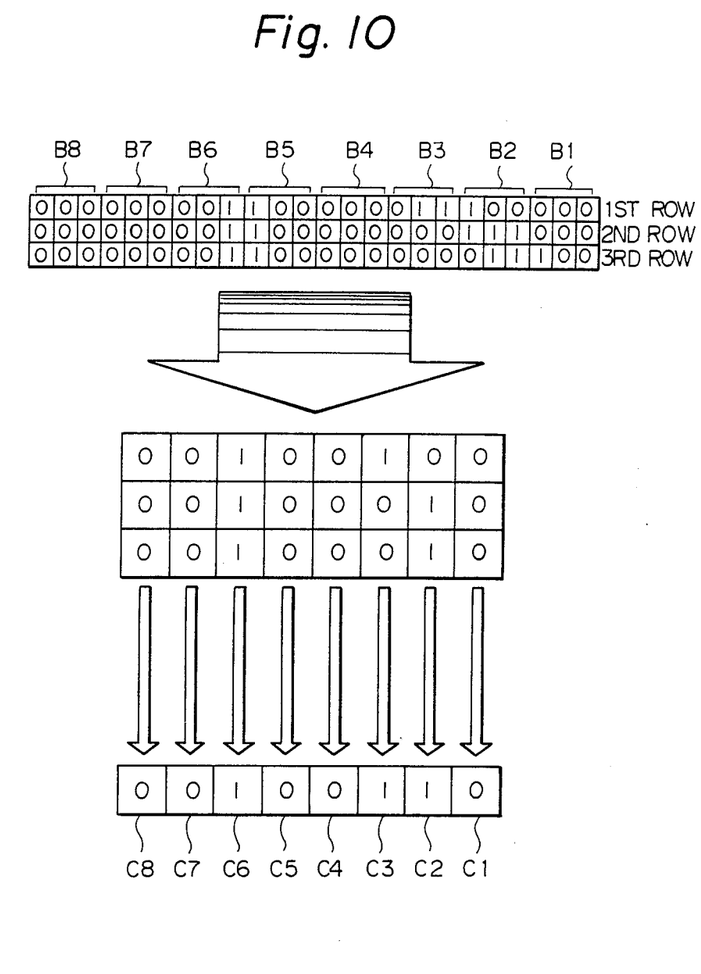
FIG. 10 shows an example of the overall reduction operations in the X and Y directions.

The above procedure is repeated on each of the second and third rows of font data (118), the results being shown in the middle of FIG. 10. Shown in the top of FIG. 10 is the font of the blocks B1 to B8 of FIG. 1 which are represented by "1" and "0".

Thereafter, Y reduction is performed (120) on the data which underwent the X reduction as described.

Data provided by the Y reduction are shown in the bottom of FIG. 10.

By the procedure discussed above, the font data in the blocks B1 to B8 are reduced as represented by bits C1 to C8 in FIG. 2.

With the flowchart shown in FIG. 6, a computer or like implement may be manipulated for font reduction based on software processing.

Hereinafter will be described an embodiment of a character font reduction device which is capable of effecting the font reduction based on the above-described technique.

Figure 11:
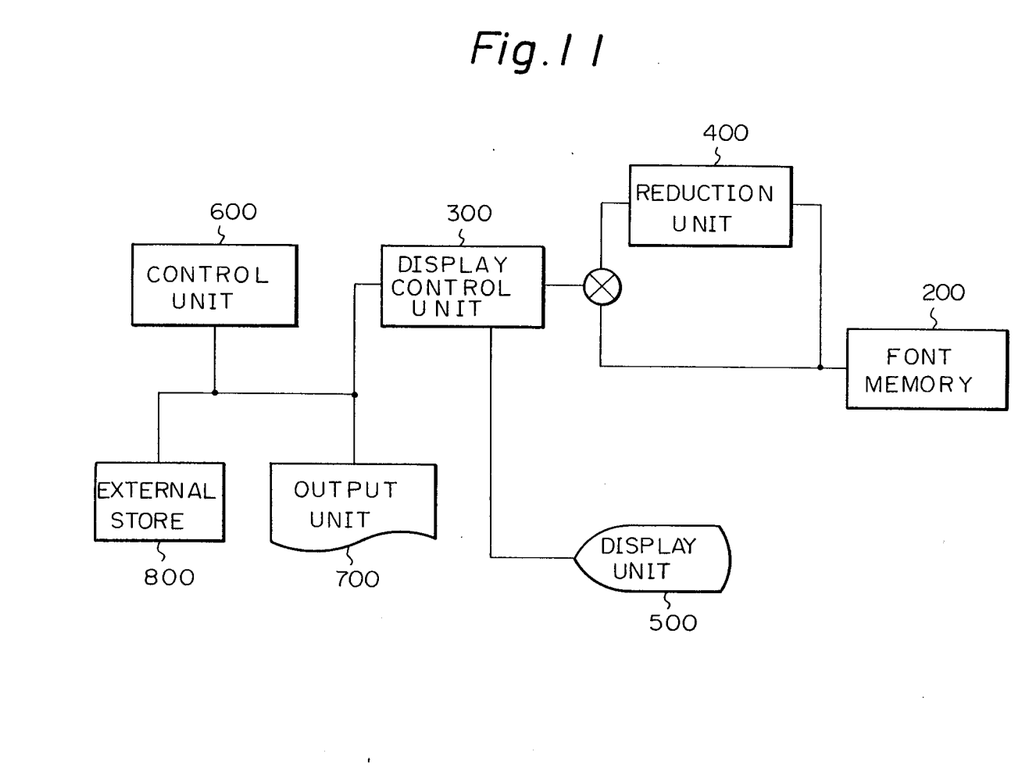
FIG. 11 is a block diagram of an exemplary system to which a character font reduction device in accordance with the present invention is applicable.

Referring to FIG. 11, an exemplary system to which the font reduction device is applicable is shown. A font memory 200 stores fonts each in a 24 by 24 bit matrix. The font memory 200 is connected directly to a display control unit 300 and to a character font reduction unit, or device, 400, which in turn is connected to the display control unit 300. Also connected to the dislay control unit 300 are a display unit 500, a control unit 600, an output unit 700 and an external storage 800.

In the illustrated system, document data to be applied to the display unit 500 or the output unit 700 are stored in the external storage 800. The document data are transferred from the external storage 800 to the display control 300 under the control of the controller 600 and, there, transformed into font data representative of associated characters. Specifically, font data in the font memory 200 are fetched character by character to the display control 300 either directly or by way of the reduction unit 400 for font reduction, based on the document data. The display control 300, based on the fetched font data, applies the usual character patterns or the reduced character patterns to the display 500 or the output unit 700 as a document. In this manner, the reduction unit 400 may be connected to the font memory 200 so as to reduce input font data which are in a usual size. The display control 300 actuates the output unit 700 to print out or display reduced characters in response to the output of the font reduction unit 400.

Figure 12:
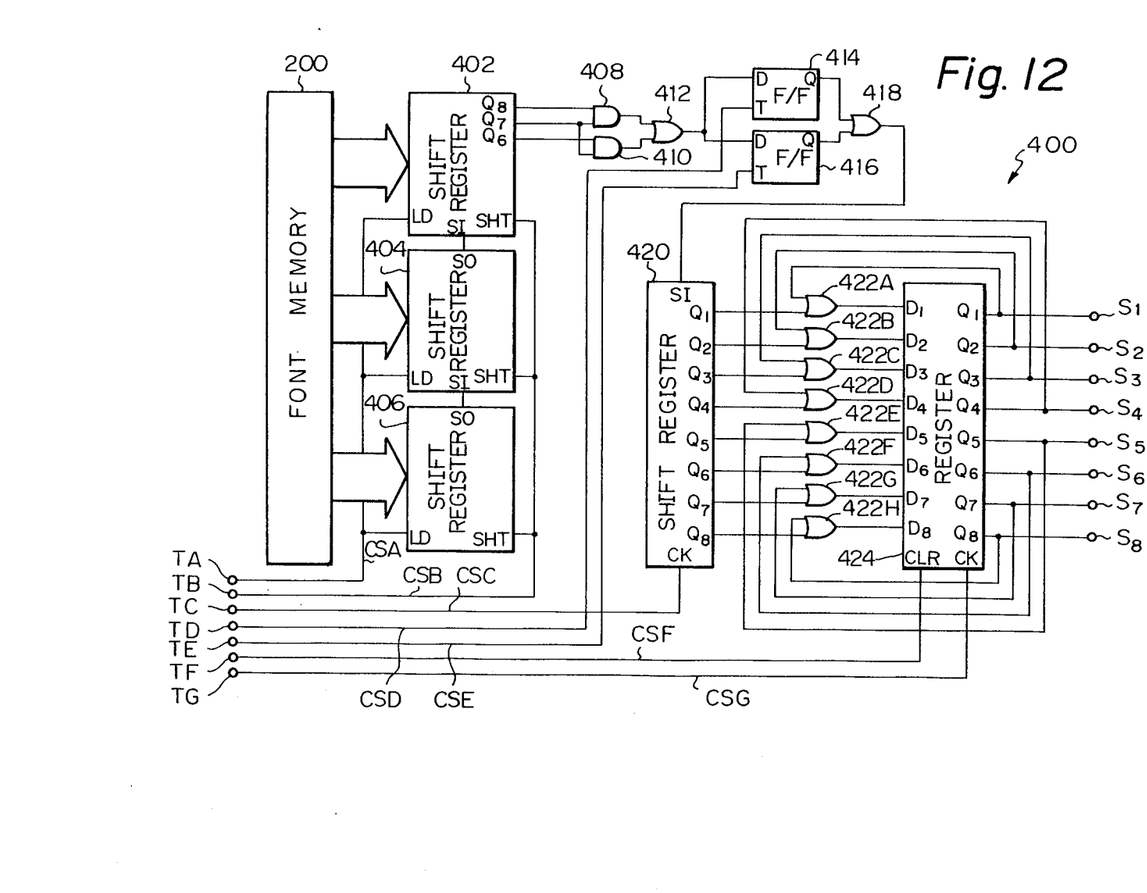
FIG. 12 is a block diagram showing an embodiment of the character font reduction device in accordance with the present invention.

The reduction unit 400 may have such a construction as one shown in FIG. 12. In the drawing, the font memory 200 stores font data in which the font of one character is represented by 24 by 24 bits. The font dafa are delivered by each 24 bits and transferred to 8-bit, parallel-in serial-out type shift registers 402, 404 and 406 eight bits each.

Load terminals LD of the shift registers 402, 404 and 406 are commonly connected to a terminal TA to which a control signal CSA is applied. The control signal CSA corresponds to a read signal associated with the font memory 200 so that the font data are latched in the shift registers 402, 404 and 406 timed to the positive going edges of the control signal CSA.

Shift clock terminals SHT of the shift registers 402, 404 and 406 are connected to a terminal TB to which a control signal CSB is applied. In response to this signal CSB, the font data latched in the shift registers 402, 404 and 406 are sequentially shifted. A data output terminal SO of the shift register 406 is connected to a data input terminal SI of the shift register 406 while a data output terminal SO of the shift register 404 is connected to an input terminal SI of the shift register 402.

Output terminals Q8 and Q7 of the shift register 402 are connected to an AND gate 408 and output terminals Q7 and Q6 to an AND gate 410. Output terminals of the AND gates 408 and 410 are connected to an OR gate 412. The AND gates 408 and 410 and the OR gate 412 serves as a circuit for the X reduction which is shown in FIG. 3.

An output terminal of the OR gate 412 is connected to input terminals D of flip-flops 414 and 416. Toggle terminals of the flip-flops 414 and 416 respectively are connected to terminals TD and TE which are adapted to receive control signals CSD and CSE, respectively. Timed to the control signal CSD and CSE, the flip-flops 414 and 416 fetch data supplied to their input terminals D and apply them to the output terminals Q. The parallel connection of the flip-flops 414 and 416 is associated with the AND operation on the reduced data before the left shift and those after the left shift as shown in FIGS. 5A and 5B. The AND operation is performed by an OR gate 418 with which the output terminals Q of the flip-flops 414 and 416 are connected.

An output terminal of the OR gate 418 is connected to a data input terminal SI of a serial-in parallel-out type shift register 420. The shift register 420 has a shift clock terminal CK connecting to a terminal TC to which a control signal CSC is applied. Timed to the control signal CSC, data are stepped from the terminal IS and thereby sequentially shifted.

The shift register 420 has output terminals Q1 to Q8 which are connected to OR gates 422A to 422H, respectively. Output terminals of the OR gates 422A to 422H respectively are connected to input terminals D1 to D8 of an eight-bit register 424. Output terminals Q1 to Q8 respectively are connected to output terminals S1 to S8 of the apparatus and, also, to the other inputs of the OR gates 422A to 422H. Meanwhile, a clear terminal CLR of the register 424 is connected to a terminal TF to which a control signal CSF is applied. The control signal CSF is adapted to clear the register 424. A terminal CK of the register 424 is connected to a terminal TG to which a control signal CSG is applied. Timed to the control signal CSG, the register 424 latches and outputs data. The OR gates 422A to 422H and the register 424 constitutes as a network for the Y reduction shown in FIG. 4.

The control signals CSA to CSG applied respectively to the terminals TA to TG as described are supplied from the display control 300 or the controller 600. The output terminals S1 to S8 are connected to the display control 300.

Figure 13:
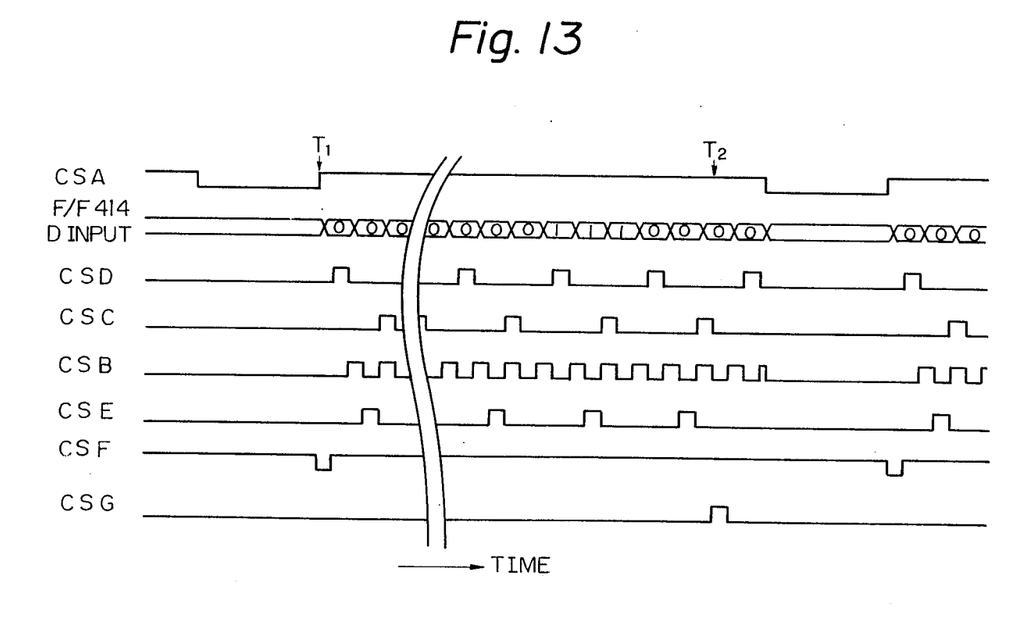
FIG. 13 is a timing chart representative of operation of the device shown in FIG. 12.

Description will proceed based on the general operation of the embodiment described above and with reference made to the timing chart of FIG. 13 as well. The following discussion will concentrate to font reduction applied to the blocks B1 to B8 shown in FIG. 1 by way of example.

At a time T1 when the control signal CSA rises, font data representative of the first row of the blocks B1 to B8 (see top of FIG. 7 or FIG. 10) are latched in the shift registers 402, 404 and 406. Specifically, the font data in the blocks B1 to B2 and part of the blocks B3 are latched in the shift register 406; font data in the remaining part of the block B3, blocks B4 and B5 and part of the block B6 are latched in the shift register 404; and font data in the remaining part of the block B6 and in the blocks B7 and B8 are latched in the shift register 402. Meanwhile, the control signal CSF clears the register 424.

In the above condition, the shift register 402 applies to its output terminals Q8, Q7 and Q6 the font data which are shown in the leftmost position in the middle of FIG. 7. In this example, the output of the OR gate 412 associated with the leftmost data "000", i.e., the result of X reduction shown in FIGS. 3A to 3B is "0". This is latched in the flip-flop 414 timed to the control signal CSD.

Then, timed to the control signal CSB, the contents of the shift registers 402, 404 and 406 are bodily shifted as shown in FIG. 8A. As a result, the output of the OR gate 412 turns out to be the result of the X reduction applied to the font data which underwent the shift. The output of the OR gate 412 is fed to the shift register 420 timed to the control signal CSC and, in the meantime, the data in the shift registers 402, 404 and 406 are shifted timed to the control signal CSB.

By the operation described so far, the three bits of font data in the first row of the block B8 are fully reduced in the X direction and the result is stored in the shift register 420.

After further shift which is caused by the control signal CSB, the above-described operation is repeated on the font data associated with the block B7 and the reduction data is stored in the shift register 420. Repeating such a procedure eight consecutive times causes Y reduction data associated with the first rows of font data in the blocks B1 to B8 (see FIG. 9) to be stored in the shift register 420. At this time, i.e., a time T2 in FIG. 13, the control signal CSG is produced and the output of the shift register 420 is applied to the register via the OR gates 422A to 422H.

When the same operation is performed on the second row of font data in the blocks B1 to B8, the X reduction data associated with the first row of font data and those associated with the second row are applied to the OR gates 422A to 422H. As a result, the outputs of the OR gates 422A to 422H represent the result of AND operation between the first and second rows of data shown in the middle of FIG. 10.

Thereafter, X reduction data associated with the third row of font data in the blocks B1 to B8 are delivered from the shift register 420. Then, they are subjected to an AND operation together with the above-mentioned operation result so that the OR gates 422A to 422H produce the Y reduction data as shown in the bottom of FIG. 10. These data respectively are routed to the output terminals S1 to S8 via the register 424. Then, the register 424 is cleared by the control signal CSF to allow the foregoing consecutive steps to be repeated on the other rows of the blocks. That is, the foregoing steps are repeated eight times to transform the 24 by 24 dot matrix shown in FIG. 1 to the reduced 8 by 8 dot matrix.

While the illustrative embodiment is constructed to reduce a 24 by 24 dots font to an 8 by 8 dots font, such is only illustrative and any other desired reduction ratio may be set up. In addition, the reduction ratios in the X and Y directions which have been shown and described as being equal are not restrictive and may differ from each other.

Furthermore, the flowchart shown in FIG. 6 and the block diagrams shown in FIG. 12 are merely for illustration and any other suitable procedure and/or circuit arangement is usable insofar as it is capable of implementing the principles of reduction shown in FIGS. 3A-5B.

In summary, it will be seen that the present invention provides a character font reduction method which eliminates the need for storage of reduced font data in a font memory to thereby save the capacity of the memory and allow a reduced font to be readily attained by means of a simple construction. This advantage is derived from the unique construction wherein font data are reduced based on font data which are stored in a font memory or a character generator in advance.

Even the case wherein reduced fonts are stored in a font memory may advantageously be implemented by the present invention. If a reduced font is generated using a font reduction program and based on an existing font, for example, time and labor which would otherwise be consumed for frequent generation of a reduced font will be saved.

Various modifications will become possible for those skilled in the art after receiving the teachings of the present disclosure without departing from the scope thereof.

What is claimed is:

1. A method of reducing a character font in which font data representative of the character font consists of a dot matrix having a plurality of rows of arranged in a first direction and a plurality of columns of arranged in a second direction perpendicular to the first direction, said method comprising the steps of:
    (a) producing first data by dividing one of the rows in the first direction into a plurality of blocks such that each of the blocks includes a predetermined number of dots and, then, converting the one row to unit dots associated with the respective blocks;
    (b) producing second data by shifting the row in the step (a) in the first direction to constitute a shifted row, then dividing the shifted row into a plurality of blocks, and then converting the shifted row to unit dots associated with the respective blocks;
    (c) computing third data by associating the first and second data with each other in the second direction;
    (d) computing third, row-by-row data by sequentially performing the steps (a), (b) and (c) in the second direction on the rows of a number which corresponds to the predetermined number;
    (e) computing fourth data by associating in the second direction the third, row-by-row data computed by the step (d);
    (f) computing the fourth data associated with the whole character font by repeating the consecutive steps (a) through (e); and
    (g) converting the respective blocks consisting of dots associated with the plurality of fourth data computed by the step (f) to unit dots associated with the respective blocks.

2. A method as claimed in claim 1, wherein step (a) comprises a step (h) of, when any of the rows of each of the blocks includes more than a predetermined number of dots immediately next to each other, making the unit dot of said block a black dot and, when otherwise, deciding that printing is needless.

3. A method as claimed in claim 1, wherein step (b) comprises a step (h) of, only when any of the rows in the first direction extends over two nearby blocks, shifting said row one dot in the first direction.

4. A method as claimed in claim 1, wherein the steps (c) and (d) comprise a step (h) of computing each of the third data by providing an AND of the first data and the second data.

5. A method as claimed in claim 4, wherein the steps (e) and (f) comprise a step (i) of computing the each of the fourth data by providing an AND of the respective third data in the second direction, and a step (j) of deciding an AND which is a ONE as a black dot.

* * * * *